United States Patent
Hülsmann et al.

(10) Patent No.: US 10,493,739 B2
(45) Date of Patent: Dec. 3, 2019

(54) REAR-SIDE FILM FOR SOLAR MODULES

(71) Applicant: Bischof + Klein SE & Co. KG, Lengerich (DE)

(72) Inventors: Philip Hülsmann, Münster (DE); Peter Lehrter, Ibbenbüren (DE)

(73) Assignee: Bischof + Klein SE & Co. KG, Lengerich (DE)

( * ) Notice: Subject to any disclaimer, the term of this patent is extended or adjusted under 35 U.S.C. 154(b) by 0 days.

(21) Appl. No.: 15/555,186

(22) PCT Filed: Mar. 2, 2016

(86) PCT No.: PCT/EP2016/000362
§ 371 (c)(1),
(2) Date: Sep. 1, 2017

(87) PCT Pub. No.: WO2016/138990
PCT Pub. Date: Sep. 9, 2016

(65) Prior Publication Data
US 2018/0050525 A1 Feb. 22, 2018

(30) Foreign Application Priority Data

Mar. 3, 2015 (DE) .......... 10 2015 103 045

(51) Int. Cl.
| | |
|---|---|
| *B32B 27/32* | (2006.01) |
| *C08K 3/34* | (2006.01) |
| *H01L 31/049* | (2014.01) |
| *C08L 23/06* | (2006.01) |
| *C08L 23/10* | (2006.01) |
| *B32B 27/08* | (2006.01) |
| *C08F 110/06* | (2006.01) |
| *C08F 216/06* | (2006.01) |
| *C08J 5/18* | (2006.01) |
| *H01L 31/048* | (2014.01) |

(52) U.S. Cl.
CPC .............. *B32B 27/32* (2013.01); *B32B 27/08* (2013.01); *C08F 110/06* (2013.01); *C08F 216/06* (2013.01); *C08J 5/18* (2013.01); *C08K 3/34* (2013.01); *C08L 23/06* (2013.01); *C08L 23/10* (2013.01); *H01L 31/049* (2014.12); *H01L 31/0481* (2013.01); *B32B 2309/105* (2013.01); *C08J 2323/12* (2013.01); *C08J 2331/04* (2013.01); *C08L 2203/204* (2013.01); *Y02E 10/50* (2013.01)

(58) Field of Classification Search
CPC .... C08L 23/10; C08L 23/06; C08L 2203/204; C08K 3/34; B32B 2309/105; B32B 27/08; B32B 27/32; C08J 2323/12; C08J 2331/04; C08J 5/18; H01L 31/0481; H01L 31/049; Y02E 10/50
See application file for complete search history.

(56) References Cited

U.S. PATENT DOCUMENTS

| | | |
|---|---|---|
| 4,792,488 A | 12/1988 | Schirmer |
| 2011/0277834 A1 | 11/2011 | Hatakeyama et al. |
| 2013/0209816 A1 | 8/2013 | Kobayashi et al. |
| 2014/0137935 A1 | 5/2014 | Hiroi et al. |

FOREIGN PATENT DOCUMENTS

| | | |
|---|---|---|
| EP | 2 390 093 | 4/2013 |
| EP | 2 860 764 | 4/2015 |
| JP | 2000-334897 | 12/2000 |
| JP | 2011-152720 | 8/2011 |
| JP | 2014-091218 | 5/2014 |

*Primary Examiner* — Lawrence D Ferguson
(74) *Attorney, Agent, or Firm* — Gudrun E. Huckett

(57) ABSTRACT

Rear-side film for solar modules, which are embedded in EVA (ethylene-vinyl acetate copolymer) which are transparent and cross-linked at a temperature of more than 140° for rear-side film applied to the rear side of the EVA and hence binding same, wherein the rear-side film consists in a multi-layer construction comprising co-extruded layers of polyolefin that are directly connected with each other, of which layers a front layer comprising a layer thickness of less than 100 μm is filled with pigments or reflecting particles in a weight proportion up to 20% and reinforced with subsequent layers to an overall strength of the rear-side film of over 300 μm, wherein the layers consist overall or with a mixture proportion of non-cross-linked polypropylene, wherein the layers lying behind the front layer are filled at least partially with an inorganic stabilising filler with a weight proportion of up to 40% relative to the weight of the rear-side film, and a method for producing a rear-side film.

13 Claims, No Drawings

REAR-SIDE FILM FOR SOLAR MODULES

BACKGROUND OF THE INVENTION

The invention concerns a rear-side film for solar modules, which are embedded in transparent EVA (ethylene vinyl acetate copolymer) that is crosslinked at a temperature of more than 140° with a rear-side film contacting the EVA and being bonded thereby, wherein the rear-side film consists in a multi-layer configuration with co-extruded layers of polyolefin that are directly connected with each other, of which a front layer with a layer thickness of less than 100 μm is filled with pigments or reflecting particles in a weight proportion of up to 20% and is reinforced with subsequent layers to a total thickness of the rear-side film of more than 300 μm. Solar modules represent plate-shaped units that can be mounted individually or in group arrangement in which electrically interconnected solar cells are arranged in a central plane and are embedded on all sides in an encapsulating material, e.g., ethylene vinyl acetate copolymer (EVA). The front side of such a solar module is formed, for example, by a glass pane as a front cover that covers the EVA embedment of the solar cells at the front side (top side) and provides good light transparency, weather resistance, scratch resistance in regard to environmental loads and cleaning actions and also a good electrical insulation of the solar cells toward the front side (top side) environment and a good mechanical stability. For covering the rear side of the solar modules, generally a rear-side film is employed which must not fulfill the specifications of the front side in regard to light transparency but must provide high specifications in regard to weather resistance, dielectric strength, and compatibility relative to the EVA embedment.

In particular, the rear-side film must be capable of being joined with the EVA embedment of the solar cells in the packet to a fixed and encapsulated unit by a lamination process in which the initially layered, loosely stacked materials at a temperature of 140° C. to 160° C. are joined with each other. In this context, the EVA is heated far beyond its softening temperatures so that it encloses the solar cells and binds to the front cover as well as to the rear-side film. Moreover, the EVA due to chemical additives or by radiation is crosslinked to a transparent material and to good weather resistance. The rear-side film is participating in this process as "outer shell", with the requirement of a corresponding temperature resistance with exclusion of shrinkage processes for pre-stretched rear-side film.

In the context of high temperature resistance, rear-side films on the basis of polyester are conventionally used which however exhibit a bad compatibility relative to EVA and are to be provided with adhesive coatings. Also, the limited long-term hydrolysis resistance of this material with a tendency to water adsorption and brittleness is disadvantageous. A multi-layered configuration of such a rear-side film with intermediate and/or cover layers as well as relatively high shrinkage during module manufacture indicate significant disadvantages of the polyester material.

EP 2 390 093 B1 discloses in contrast thereto a rear-side film on the basis of polyethylene, wherein a material of polyethylene homopolymers and copolymers is joined directly, without adhesive layers, by co-extrusion. Polyethylene material has the benefit of a good compatibility with EVA within the solar module configuration. A problem is however the temperature resistance of the polyethylene material that is to be raised by select material components and in particular also by crosslinking of the material. Aside from the crosslinking expenditure, the limited temperature resistance not only during the EVA embedding process but also in the long run remains however critical when a solar module is to be used outdoors over decades, for example.

Object of the invention is to find a rear-side film for solar modules which can be produced to be weather-resistant and thermally robust as well as cost efficient and that enables in particular the production of resistant and cost-efficient solar modules with decade-long functionality.

SUMMARY OF THE INVENTION

Based on a rear-side film of the aforementioned kind, this object is solved according to the invention in that the layers, as a whole or with a mixture proportion, consist of non-crosslinked polypropylene, wherein the layers which are positioned behind the front layer are filled at least partially with an inorganic stabilizing filler with a weight proportion of up to 40% relative to the weight of the rear-side film. Furthermore, the object is solved with a method characterized in that the rear-side film is produced by co-extrusion of a flat cast film web with a plurality of layers of polypropylene from flat nozzles, wherein the layers at least partially contain different fillers; a method characterized in that a flat film with a plurality of layers is generated in an even numbered and mirror-symmetrical layer arrangement by co-extrusion of a film hose with a plurality of layers from an annular nozzle, subsequent blow forming and blocking of the laid-flat film hose prior to hardening; as well as a method characterized in that a film hose with all layers of the rear-side film is extruded from an annular nozzle, widened to a blown film, and cut in longitudinal direction.

DESCRIPTION OF PREFERRED EMBODIMENTS

The rear-side film of the invention provides a composite of layers of polypropylene or of a polyolefin mixture with a significant proportion of polypropylene which results in a significant increase of the utilizable temperature range relative to polyethylene-based plastic mixtures. Accordingly, first and foremost a cumbersome and cost-increasing crosslinking of the material is unnecessary. Further expansions of the available temperature range can be obtained by inorganic stabilizing fillers which also may improve the mechanical properties of the film and also counteract shrinkage behavior. Beneficial with regard to polypropylene in this context is also the versatility, the knowledge of skilled artisans in regard to applications for broad and widely branched fields of use, and the long-term experiences with the staple material. It is understood in this context that known susceptibilities of polypropylene with regard to oxidation, light sensitivity or flammability can be treated reliably and proven by conventional antioxidants, light stabilizers, UV absorbers, and fire retardants. In an embodiment, the filler is substantially comprised of talc or other acid-resistant mineral materials. In an embodiment, the filler in the layers which are positioned behind the front layer has a weight proportion of the layer of at least 5%. In an embodiment, the layers as a whole are arranged even numbered and mirror-symmetrical. In an embodiment, the two neighboring innermost layers contain an admixture of 30 to 60% of polyethylene. In an embodiment, the two innermost layers each have a thickness of less than 80 μm. In an embodiment, the two innermost layers do not contain talc. In an embodiment, the front layer contains a proportion of up to 30% of polyethylene. In an embodiment, the rear-side film is comprised of a multi-layer blown film hose which, prior to hardening, is symmetrically doubled by laying flat and blocking.

Such a rear-side film can be inexpensively produced by way of co-extrusion with layers that are directly interconnected with each other. In particular, co-extrusion eliminates a connection of the layers by intermediate layers with adhesive materials which require additional working steps.

In the context of uniformity of the film thickness and also of the layered arrangements, the layers are to be produced with limited layer thickness by co-extrusion. This applies in particular with respect to a total thickness of the rear-side film of more than 300 μm (0.3 mm) which results regularly already based on the required dielectric strength of the rear-side film for voltages up to e.g. 20 KV, which however must also take into account the specifications of the solar module in regard to mechanical loads. As a result, the rear-side film is constructed of a plurality of co-extruded layers. In this context, the hardness and stiffness to be attributed generally to the polypropylene is certainly advantageous, as needed, also the impact strength that is easily adjustable by modification as is known in the art.

In a multi-layer construction of the rear-side film, in a conventional way a front layer, facing the solar cells and connected directly with the EVA embedment, is designed for reflection of light which passes the solar cells laterally or as scattered light and is to be reflected for residual utilization. In this context, a first layer of a thickness of less than 100 μm preferably approximately only 50 μm, is filled with pigments such as titanium dioxide and/or with reflecting particles up to a weight proportion of approximately 20% so that the light is reflected through the crystal-clear cross-linked EVA embedment to the solar cells or to the front cover in the meaning of internal reflection. For improved adhesion of the front layer to the ethylene vinyl acetate copolymer embedment of the solar cells, a proportion of up to 60% of a polyethylene or of a polyethylene copolymer can be added to the polypropylene of the front layer.

The total thickness of the rear-side film remaining behind the front layer is advantageously further divided into layers. For example, an externally positioned layer, as is frequently common, can be pigmented so as to be white or reflective for purely visual aspects and also for reflection of rearwardly impinging thermal radiation. Accordingly, the rear external layer which is opposite the front layer can be specified to be the same material as the front layer and can be fed from the same extruder for co-extrusion.

Intermediately positioned layers are in particular provided with an inorganic stabilizing filler with a weight proportion of up to 40%, relative to the total weight of the rear-side film, in order to achieve thereby higher mechanical strengths as well as an increased temperature resistance and to counteract shrinkage tendencies during the lamination process of the EVA as well as during long-term use.

As a filler, aside from other acid-resistant mineral materials, in particular talc is considered which has been tested and established in relation to polypropylene, even in relation to a long-term weather resistance of the material. Acid resistance of the filler is of interest with respect to possible long-term developments of the EVA materials to an acidic state. In this context, the filler in the individual layers can have a weight proportion of the layer of at least 5%, respectively, in order to stabilize or stiffen as a whole a layer or individual layers in particular during crosslinking of the EVA material in the course of the manufacture as well as, as the case may be, during decade-long use against shrinkage tendencies of the material in the long run.

A very flexible manufacturing-technological realization of such a rear-side film is possible by way of co-extrusion to a flat cast film web in which a plurality of layers of polypropylene are extruded from a flat nozzle and combined. In this context, a plurality of specified layers, each provided with a limited thickness, are of interest in order to control the layer thickness and thus also the total thickness of the rear-side film. In this context, the respective layers with respect to material and with respect to fillers can be provided to be different relative to each other for a sufficient number of available extruders. However, this does not preclude in any way that two or a plurality of layers of the same material are provided in order to position them, for example, in a layer sequence separate from each other or, for multiplying the layer thickness, also adjacent to each other.

Another method for producing a rear-side film that is of interest under the aspect of manufacturing costs and realizable in practice in a particularly simple way resides in the manufacture of a multi-layer blown film hose with co-extrusion of several layers of or with a polypropylene, wherein the blown film hose, after extrusion and blow forming, is deflected and laid flat across rollers or is flattened by being compressed between rollers so that the blown film hose is formed to a flat film strip by inner blocking at the inner layers that are resting on each other.

In this way, a multi-layer flat film with an even numbered layered arrangement and (mirror) symmetrical layer construction is provided. When, for example, the external layer of the blown film is formed by a polypropylene that is filled with pigments or reflecting particles, then this layer forms a front layer of the rear-side film as well as an oppositely positioned rear layer with corresponding coloring and corresponding reflection properties. An intermediate layer of the blown film that after blocking is then repeated symmetrically in the layered arrangement in the rear-side film can in particular accommodate suitable fillers. An inner layer of the blown film that after blocking is appearing doubled at the inner side in the rear-side film is expediently to be embodied with regard to blocking. Fillers such as talc which are otherwise used also as anti-blocking agents are expediently to be provided in reduced quantity or to be omitted. For an effective blocking process, the inner layer of the blown film can even be provided with an admixture of up to 60% of polyethylene aside from the polypropylene in order to produce, on the one hand, an effective blocking connection of the sides of the inner layer to be joined due to the low melting point of the polyethylene and, on the other hand, ensure a stability of the layer due to the polypropylene. Preferably, the inner layer in comparison to the other layers is to be embodied to be thinner, less than 50 μm thick, respectively.

Both methods for producing the rear-side film, i.e., the co-extrusion of a flat cast film as well as co-extrusion of a blown film with subsequent blocking can be performed on an industrial scale in an easily controllable and also cost-efficient way and open up the possibility of providing a film based on polypropylene that remains stable and without shrinkage in particular thermally during a lamination process of the solar modules and that also in long-term use, often conceptualized for decades, of the solar module ensures weather resistance and mechanical stability as well as fixed cohesion with the EVA embedment of the solar cells.

In principle, a multi-layer film with a construction like the cast film, for example, with a layer sequence that is repeated non-mirror symmetrically or uneven number of layers, can be produced also as blown film by way of a co-extrusion with complete number of layers so that the blown film (without blocking) must only be cut lengthwise to a rear-side film.

In embodiments, two externally positioned layers are formed of coinciding material. In embodiments, the intermediate layers of the film are extruded with predetermined maximum layer thickness with coinciding material. In embodiments, at least one further layer of polypropylene with an inorganic filler in a weight proportion of at least 5% is extruded in the co-extrusion. In embodiments, in the co-extrusion an innermost layer of a mixture of polypropylene and polyethylene is extruded.

The rear-side film can be ready-made to modular individual pieces which are tailored to individual solar modules and then, together with a set of solar cells, its coating with EVA on both sides, and a front cover, pass through a lamination device.

What is claimed is:

1. A rear-side film for solar modules, wherein the solar modules are embedded in transparent EVA (ethylene vinyl acetate copolymer) crosslinked at a temperature of more than 140° with a rear-side film contacting the EVA and being bonded thereby to the EVA, the rear-side film comprising:
   a multi-layer configuration comprising co-extruded layers of polyolefin that are directly connected with each other, wherein the multi-layer configuration as a whole comprises an even number of the co-extruded layers arranged mirror-symmetrical to a mirror plane, wherein the co-extruded layers of polyolefin include a first external layer as a front layer and a second external layer as a rear layer arranged opposite the front layer relative to the mirror plane and further include additional layers arranged between the front layer and the rear layer;
   wherein the front layer has a layer thickness of less than 100 μm and is filled with pigments or reflecting particles in a weight proportion of up to 20%;
   wherein the rear-side film has a total thickness of more than 300 μm;
   wherein the co-extruded layers are entirely comprised of non-crosslinked polypropylene or contain a mixture proportion of non-crosslinked polypropylene;
   wherein at least some of the additional layers arranged between the front layer and the rear layer are filled with an inorganic stabilizing filler with a weight proportion of up to 40% relative to the weight of the rear-side film and a weight proportion of the layers of at least 5%, respectively, wherein the filler is substantially comprised of talc or acid-resistant mineral materials.

2. The rear-side film according to claim 1, wherein the co-extruded additional layers include two neighboring innermost layers comprising an admixture of 30% to 60% of polyethylene.

3. The rear-side film according to claim 2, wherein the two innermost layers each have a thickness of less than 80 μm.

4. The rear-side film according to claim 2, wherein the two innermost layers do not contain talc.

5. The rear-side film according to claim 1, comprised of a multi-layer blown film hose which, prior to hardening, is symmetrically doubled by laying flat and blocking to produce the even number of the co-extruded layers arranged mirror-symmetrical to the mirror plane.

6. The rear-side film according to claim 1, wherein the front layer comprises a proportion of up to 30% of polyethylene.

7. A method for producing a rear-side film according to claim 1, the method comprising:
   co-extruding the multi-layer configuration as a flat cast film web, comprising the co-extruded layers of polypropylene, from flat nozzles, wherein the co-extruded layers at least partially contain different fillers.

8. The method according to claim 7, wherein the front and rear layers of the co-extruded layers are formed of identical material.

9. The method according to claim 7, wherein the additional layers are extruded of identical material and with a predetermined maximum layer thickness.

10. A method for producing a rear-side film according to claim 1, the method comprising:
    generating a flat film comprising the multi-layer configuration, comprising the even number of the co-extruded layers that are arranged mirror-symmetrical to the mirror plane, by co-extruding a film hose from an annular nozzle, subsequently blow forming the film hose, laying flat the film hose to form a laid-flat film hose, and blocking the laid-flat film hose prior to hardening.

11. The method according to claim 10, further comprising producing within an external layer of the film hose during co-extrusion at least one layer of polypropylene with an inorganic filler in a weight proportion of at least 5%.

12. The method according to claim 10, wherein an innermost layer of the film hose is extruded from a mixture of polypropylene and polyethylene.

13. A method for producing a rear-side film according to claim 1, the method comprising:
    extruding from an annular nozzle a film hose comprising all of the co-extruded layers of the multi-layer configuration;
    widening the film hose to a blown film; and
    cutting the blown film in a longitudinal direction of the blown film.

* * * * *